United States Patent [19]

Iida et al.

[11] Patent Number: 4,618,847
[45] Date of Patent: Oct. 21, 1986

[54] C-R TYPE D/A CONVERTER

[75] Inventors: Tetsuya Iida, Yokohama; Fuminari Tanaka, Kawasaki, both of Japan

[73] Assignee: Tokyo Shibaura Denki Kabushiki Kaisha, Kawasaki, Japan

[21] Appl. No.: 586,721

[22] Filed: Mar. 6, 1984

[30] Foreign Application Priority Data

Mar. 8, 1983 [JP] Japan .................................. 58-37941

[51] Int. Cl.$^4$ ............................................. H03K 13/02
[52] U.S. Cl. ......................... 340/347 DA; 340/347 M; 340/347 C
[58] Field of Search ................. 340/347 AD, 347 CL, 340/347 M, 347 C, 347 DA

[56] References Cited

U.S. PATENT DOCUMENTS 3,611,356 10/1971 Jensen .......................... 340/347 DA
4,200,863 4/1980 Hodges et al. ............... 340/347 DA

FOREIGN PATENT DOCUMENTS 7102345 9/1971 Netherlands ................ 340/347 DA

OTHER PUBLICATIONS

Haque et al., "A Two Chip PCM Voice CODEC with Filters," IEEE Journal of Solid-State Circuits, vol. SC-14, No. 6, 12/79.
Ohri et al., "Integrated PCM Codec," IEEE Journal of Solid-State Circuits, vol. SC-14, No. 1, 2/79.

Primary Examiner—T. J. Sloyan
Attorney, Agent, or Firm—Finnegan, Henderson, Farabow, Garrett & Dunner

[57] ABSTRACT

A C-R type D/A converter which comprises a C-array type D/A converter used to convert the upper bit data of a digital input data on a digital-to-analog basis, an R type D/A converter used to convert the lower bit data of the digital input data, and a coupling capacitor connected between an output terminal of the C-array type D/A converter and an output terminal of the R type D/A converter.

1 Claim, 10 Drawing Figures

C-R TYPE D/A CONVERTER

BACKGROUND OF THE INVENTION

The present invention relates to a D/A (digital-to-analog) converter used in various electronic appliances and, more particularly, to a C-R type D/A converter which uses a capacitor array and a resistor string.

The type of circuit used for a D/A converter includes an R-2R ladder type circuit using a resistor network, a segment type circuit using a resistor string, a C-array type circuit using a capacitor array, a C-C type circuit prepared by coupling two sets of capacitor arrays, a C-R type circuit formed by combining together the C-array type circuit and R-segment type circuit, etc.

Where the R-2R ladder circuit is constituted by ion implantation resistors, the resistance value is varied due to the back gate effect with the result that the D/A conversion precision is decreased. Therefore, the R-2R ladder circuit has a drawback in that the number of bits capable of being converted is around 7 bits at most. Further, where the R-2R ladder circuit is formed with the use of impurity diffusion resistors or polysilicon resistors, the resistance value is small. Therefore, it is impossible to obtain a high conversion precision unless the resistance value of switch elements, controlled by digital input data, is made extremely small. However, it is technically difficult to make the resistance value of the switch elements extremely small. In this case as well, therefore, high conversion precision is not obtained.

Figure 1:
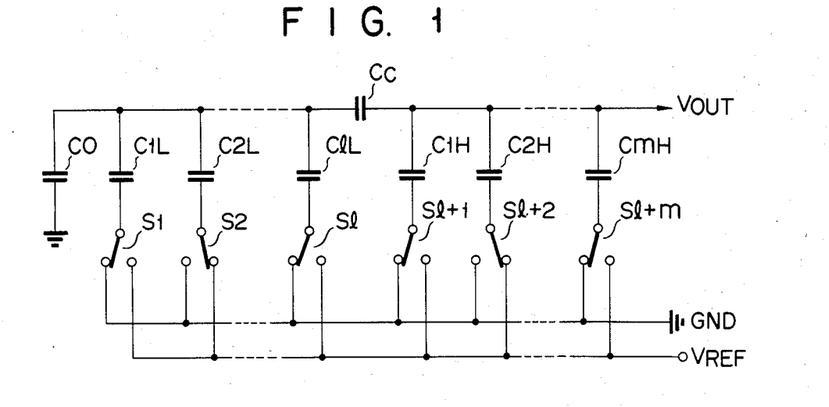
FIG. 1 is a circuit diagram showing a D/A converter comprised of a C-C type circit.

In the segment type circuit using a resistor string or strings, resistor elements should be provided $m = 2^n$ in number where the number of bits to be converted is "n". For this reason, when it is desired that a larger number of bits undergo a conversion operation, the area occupied by the resistor elements on a semiconductor chip becomes very large. This makes high integration impossible. Besides, the cost of the converter device increases.

Where the C-array type circuit is used to form a D/A converter, it is possible to increase the conversion precision because the capacitor is less dependent upon the voltage involved. In this case, however, the minimum capacitance value can not be made smaller than a specified value, and as the number of bits being treated increases, the capacitance value of upper bits, sequentially more weighted, increases accordingly. As a result, the area occupied by the capacitors on a semiconductor chip greatly increases, and the device cost rises.

Where the C-C type circuit is used for a D/A converter, it has the construction shown in FIG. 1. In FIG. 1, a capacitor C0 is a capacitor having a unit-capacitance C, and a capacitor Cc is a coupling capacitor. Capacitors C1L, C2L, ..., ClL are used for conversion of lower bits, while capacitors C1H, C2H, ..., CmH are used for conversion of upper bits. The capacitance values of the lower-bit capacitors C1L, C2L, ..., ClL are C, 2C, ..., $C^{l-1} \cdot C$, respectively, while the capacitance values of the upper-bit capacitors C1H, C2H, ..., CmH are C, 2C, ..., $2^{m-1} \cdot C$, respectively. Switches S1, S2, ..., Sl are connected correspondingly to the lower bit capacitors C1L, C2L, ..., ClL, respectively. These switches are controlled by the lower bits V1, V2, ..., Vl of a digital input data. Switches Sl+1, Sl+2, ..., Sl+m are connected correspondingly to the upper bit capacitors C1H, C2H, ..., CmH, respectively, and are controlled by the upper bits Vl+1, Vl+2, ..., Vl+m of a digital input data, respectively. The switches S1, S2, ..., Sl, Sl+1, Sl+2, ..., Sl+m are controlled in accordance with the logic level of their corresponding input bit data V1, V2, ..., Vl, Vl+1, Vl+2, ..., Vl+m. More specifically, where the bit data has a logic level of "1", the switches are so controlled as to select a reference voltage Vref. Where the bit data has a logic level of "0", the switches are so controlled as to select a ground voltage GND. The lower and upper bit capacitors are thus respectively connected to the reference voltage Vref or the ground voltage GND.

When, with the above-mentioned construction, the total capacitance Ceff of the lower bit-capacitor array, as viewed from the coupling capacitor Cc, is set at a value equal to the unit-capacitance C of the capacitor C0, the output voltage Vout is expressed as follows.

$$V_{out} = \frac{\sum_{k=1}^{l} Vk \cdot 2^{k-1} + \sum_{k=l+1}^{l+m} Vk \cdot 2^{k-1}}{2^{l+m}} V_{ref} \quad (1)$$

Where Vk represents the logic level of "1", or "0", the symbol k representing 1, 2, ..., l+m.

Figure 2:
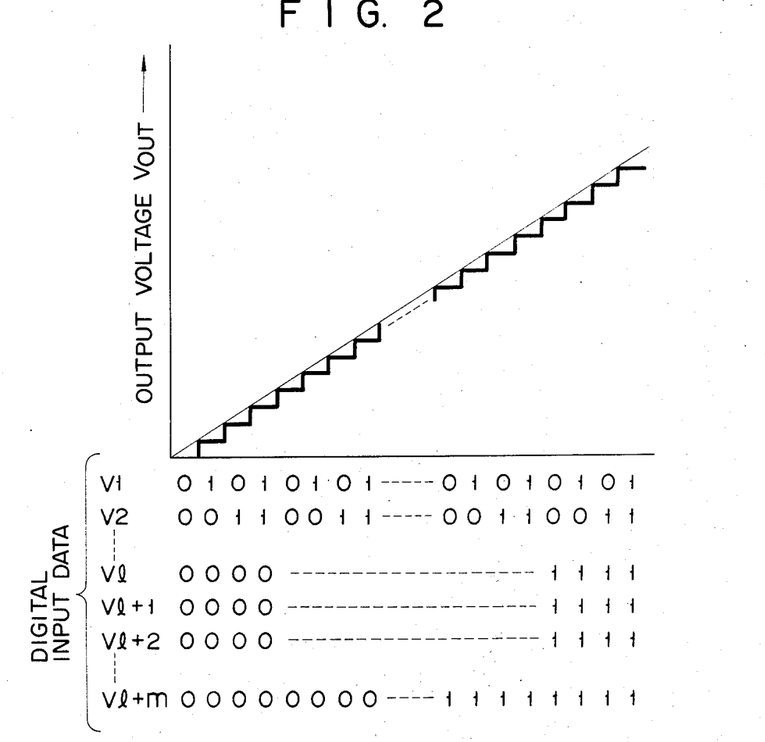
FIG. 2 shows a D/A conversion characteristic of the D/A converter of FIG. 1.

The D/A conversion characteristic expressed by the formula (1) is graphically shown in FIG. 2 as a linear characteristic curve.

In order that the total capacitance Ceff and the unit capacitance C, when set, may be equalized, however, the following conditional formula must be satisfied. Namely, $$C_{eff} = \frac{2^l \cdot C \cdot C_c}{2^l \cdot C + C_c} = C \quad (2)$$

$$\therefore \frac{C_c}{C} = \frac{2^l}{2^l - 1}$$

As seen in the formula (2), setting the total capacitor Ceff and the unit-capacitance C to equal value makes it necessary to set the capacitance value of the coupling capacitor Co to a value obtained by multiplying the unit-capacitance C by $(2^l/2^{l-1})$. That is to say, the capacitance value of the coupling capacitor Cc must be set at a value equal to a non-integral multiple of the unit-capacitance C of the capacitor array. However, a much higher manufacturing precision is required for setting such a non-integral multiple from the standpoint of manufacturing technique. Namely, it is difficult to achieve such high precision in the actual manufacturing process.

Figure 3:
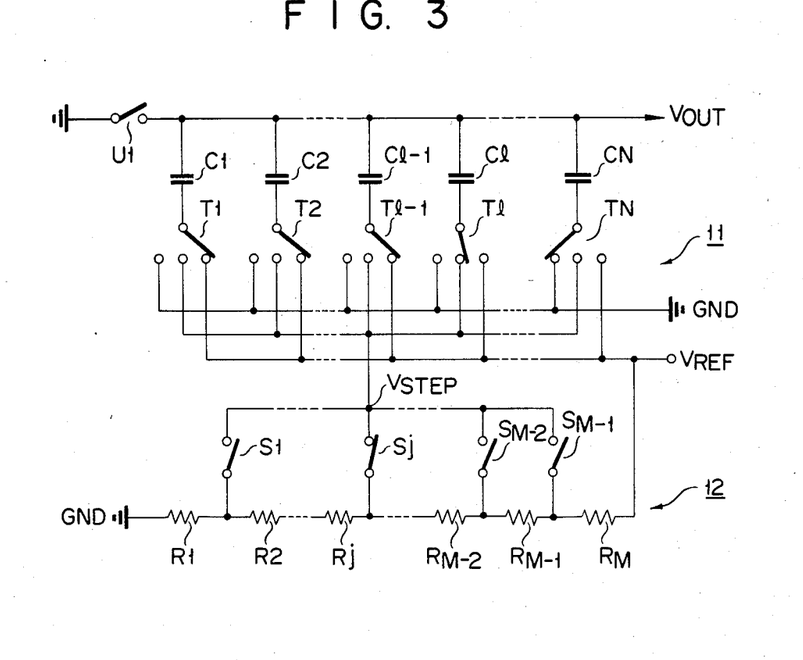
FIG. 3 is a circuit diagram showing a prior art C-R type D/A converter.
Figure 4:
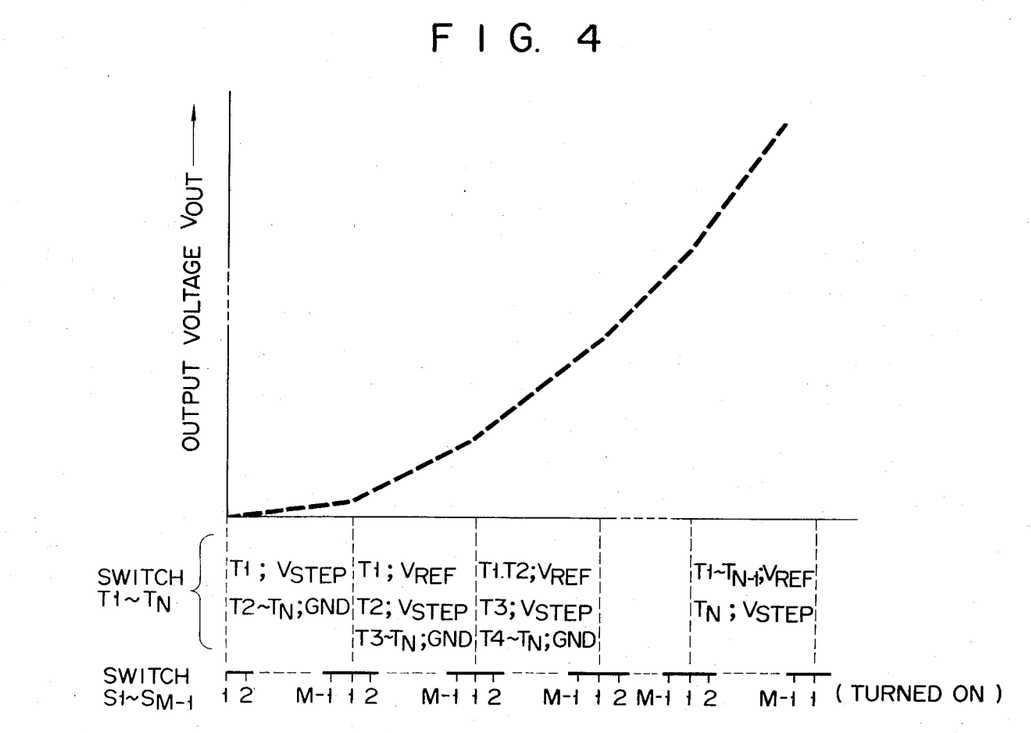
FIG. 4 shows a D/A conversion characteristic of the prior art D/A converter shown in FIG. 3.

In the C-R type circuit, a C-array type circuit 11 and a segment type circuit 12, comprised of a resistor string, are combined together into a converter, as shown in FIG. 3. In this C-R type circuit, the resistor string comprised of resistor elements R1, R2, ..., Rj, ..., $R_{M-2}$, $R_{M-1}$, $R_M$ is connected between the reference voltage Vref and the ground voltage GND. Switches S1, ..., Sj, ..., $S_{M-2}$, $S_{M-1}$ are commonly connected at one end to an output node of Vstep voltage and connected at the other end to one end of their corresponding resistor elements R1, R2, ..., $R_{M-1}$, respectively. On the other hand, switches T1, T2, ..., $T_N$ connect to any one of the reference voltage Vref, ground voltage GND and Vstep voltage output node ends of their corresponding capacitors C1, C2, ..., $C_N$ (whose capacitance values are weighted in a binary manner so that those values may become sequentially greater from the capacitor C1 toward the capacitor $C_N$), respectively, and the other ends being commonly connected to the output voltage terminal Vout. The capacitance value Ci is set such that $Ci=2^{i-1} \cdot C$, where i represents $1, 2, \ldots, 1, \ldots, N$ and C represents the unit-capacitance of the capacitors $C_1, \ldots, C_N$. The switches $S_1, S_{M-1}$ and $T_1, \ldots, T_N$ are controlled, as indicated in FIG. 4, in accordance with the digital input bit data. Note here that, in FIG. 4, the numbers shown on the abscissa with respect to the switches $S_1$ to $S_{M-1}$ represent the switches turned on. That is to say, the switches $S_1, \ldots, S_{M-1}$ are controlled in accordance with the logic levels of their corresponding lower bits of the digital input data, whereby any one of them is selectively turned on. On the other hand, the switches $T_1, T_2, \ldots, T_N$ are controlled such that, as the upper bits of the digital input data increase in the bit location rank, they are sequentially turned on from the switch $T_1$ toward $T_N$. Further, a switch U1 is connected between an output terminal Vout of the C-array type circuit 11 and the ground voltage GND. The switch U1 is temporarily turned on in advance of the D/A conversion operation.

When it is assumed that the switch Sj of the switches $S_1, \ldots, S_{M-1}$ (provided, however, that $1 \leq j \leq M-1$) has been turned on, then the voltage Vstep is expressed as follows.

$$V_{step} = \frac{j}{M} V_{ref} \tag{3}$$

When it is assumed that, at this time, the switches T1 to Tl−1 are connected to the reference voltage Vref; the switch Tl is connected to the Vstep output node; and the switches Tl+1 to $T_N$ are connected to the ground voltage GND, then the output voltage Vout is expressed as follows:

$$V_{out} = \frac{\sum_{i=1}^{l-1} C_i + \frac{j}{M} C_l}{\sum_{i=1}^{N} C_i} V_{ref} \tag{4}$$

At this time, the capacitance value is $C1=2^{i-1} \cdot C$ (where C represents the unit-capacitance of the capacitor array $C_1, \ldots, C_N$, i.e., the capacitance of the capacitor C1 and $i=1, 2, \ldots, 1, \ldots, N$). Namely, the capacitors $C_1, \ldots, C_N$ are sequentially weighted in a bindary manner. Therefore, the above formula (4) is rewritten as follows.

$$V_{out} = \frac{\sum_{i=1}^{l-1} 2^{i-1} + \frac{j}{M} 2^{l-1}}{\sum_{i=1}^{N} 2^{i-1}} V_{ref} \tag{5}$$

By the way, $$\sum_{i=1}^{l-1} 2^{i-1} = 2^{l-1} - 1, \quad \sum_{i=1}^{N} 2^{i-1} = 2^N - 1 \tag{6}$$

Therefore, $$V_{out} = \frac{2^{l-1} - 1 + \frac{j}{M} 2^{l-1}}{2^N - 1} V_{ref} \tag{7}$$

$$= \frac{(M+j)2^{l-1} - M}{M(2^N - 1)} V_{ref}$$

The D/A conversion characteristic expressed by the above formula (7) has a non-linearity, as shown in FIG. 4.

The converter device having such a non-linear characteristic as shown in FIG. 4 has its use limited, for example, to use in a PCM coder or PCM decoder of a PCM (pulse code modulation) transmission terminal device. In the case of requiring the use of a linear characteristic, it is impossible to employ the C-R type circuit such as that shown in FIG. 3.

SUMMARY OF THE INVENTION

The present invention has been accomplished in view of the above-mentioned circumstances and has as its object to provide a C-R type D/A converter which has a linear D/A conversion characteristic, is small, and also inexpensive.

According to the invention, there is provided a C-R type D/A converter comprising a C-array type D/A converter including a plurality of capacitors having capacitances sequentially weighted in a binary manner and a plurality of first switches provided correspondingly to said capacitors, whereby said first switches are controlled by the upper bits of a digital input data and are selectively connected to a first power source voltage or second power source voltage, thus converting said upper bits on a digital-to-analog basis; an R type D/A converter including a plurality or resistors and a plurality of second switches provided correspondingly to said resistors, whereby said second switches are controlled in accordance with the lower bit data of said digital input data, thereby outputting a voltge varying in a stepwise manner between said first power source voltage and said second power source voltage; and a capacitive coupler connected between an output point of said C-array type D/A converter and an output point of said R type D/A converter.

DETAILED DESCRIPTION OF THE PREFERRED EMBODIMENTS

Figure 5:
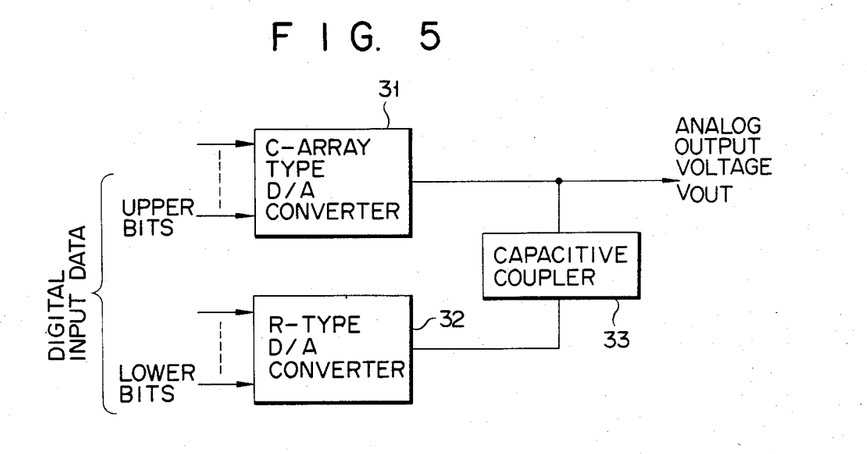
FIG. 5 is a block diagram showing a basic construction of the D/A converter of the present invention.

FIG. 5 is a block diagram which shows a basic construction of the C-R type D/A converter according to the present invention.

A C-array type D/A converter 31 and R-type D/A converter 32 respectively convert the upper bits and the lower bits of digital input data on a from-digital-to-analog basis. The R type D/A converter 32 is a segment type based on the use of an R-2R ladder type circuit or a resistor string. Both the C-array type D/A converter 31 and the R-type D/A converter 32 have their outputs mutually connected through a capacitive coupler 33. The capacitive coupler 33 serves to superpose the output of the R-type D/A converter 32 upon the output of the C-array type D/A converter 31. From this C-array type D/A converter 31, the output voltage Vout of the circuit of FIG. 5 is taken out.

Figure 6:
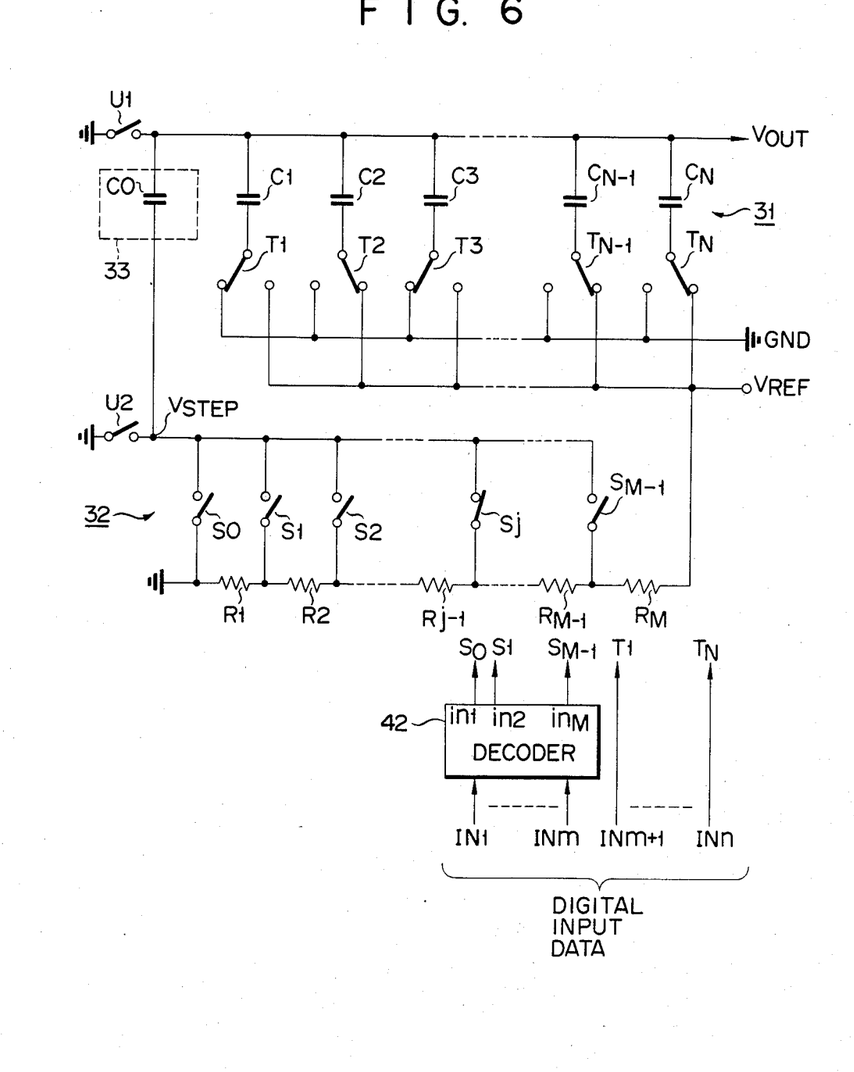
FIG. 6 is a circuit diagram showing a C-R type D/A converter according to an embodiment of the present invention.

The C-R type D/A converter, according to an embodiment of the present invention, will now be described with reference to FIG. 6 showing a circuit diagram of this embodiment. In the circuit diagram of FIG. 6, the R type D/A converter 32 is a segment type circuit comprised of a resistor string. A plurality of resistor elements $R_1, R_2, \ldots, R_{j-1}, \ldots, R_{M-1}, R_M$ (hereinafter, referred to as a resistor string) is connected in series between a reference voltage Vref, constituting one power source voltage, and a ground voltage GND, constituting the other power source voltage. Switches $S_0, S_1, \ldots, S_j, \ldots, S_{M-1}$ are provided to the resistor string $R_1, R_2, \ldots, R_{j-1}, \ldots, R_{M-1}, R_M$, respectively, in such a manner that one end of these switches, corresponding to these resistor string elements, is connected to one end of the resistor string elements at the ground voltage side. The other end of the switches is commonly connected to each other, and this point of common connection consitutes a Vstep voltage output node.

The switches $S_0, \ldots, S_{M-1}$ receive the outputs $in_1, \ldots, in_M$ of a decoder 42, respectively. The decoder 42 decodes the lower bits $IN_1, \ldots, IN_m$ (binary code) of a digital input data, thereby outputting a signal capable of selecting any one of the switches $S_0, \ldots, S_{M-1}$. In the C-array type D/A converter 31, a plurality of capacitors $C_1, C_2, \ldots, C_{N-1}, C_N$, constituting a capacitor array, is connected at one end to common-connection point, and the common-connection point constitutes an output terminal of the converter arrangement according to this embodiment. Switches $T_1, T_2, \ldots, T_{N-1}, T_N$ are provided correspondingly to the capacitor array $C_1, C_2, \ldots, C_{N-1}, C_N$. The other ends of the capacitor array elements $C_1, C_2, \ldots, C_{N-1}, C_N$ are connected to the reference voltage Vref or ground voltage GND through the switches $T_1, T_2, \ldots, T_{N-1}, T_N$, respectively. These switches receive the upper bits $IN_{m-1}, IN_{m-2}, \ldots, IN_{n-1}, IN_n$ of a digital input data, respectively, and are controlled by such upper bits.

Each switch $T_1, T_2, \ldots, T_{N-1}$, or $T_N$ is connected to the reference voltage Vref when its corresponding input bit has a logic level of "1" and is connected to the ground voltage GND when its corresponding input bit has a logic level of "0". Note here that the capacitors $C_1, C_2, \ldots, C_{N-1}$ and $C_N$ of the capacitor array are weighted in a binary manner ($C_i = 2^{i-1} \cdot C_1$) so that their capacitance values $C_i$ ($1 \leq i \leq N$) may sequentially become greater from the capacitor $C_1$ toward $C_N$, respectively. The Vstep output of the segment type D/A converter 32 and the Vout output of the C-array type D/A converter 31 are connected to each other through a coupling capacitor C0, which constitutes the capacitive coupler 33. The capacitance value C of the coupling capacitor C0 is a unit-capacitance value and thus is set at a value equal to the capacitance value C of that minimum-weighted capacitor $C_1$ of the capacitor array $C_1, C_2, \ldots, C_N$, which is so arranged as to have a minimum capacitance value.

Further, a switch U1 is provided between the Vout output of the C-array type D/A converter 31 and the ground voltage GND. A switch U2 is provided between the Vstep output of the segment type D/A converter 32 and the ground voltage GND. These switches U1 and U2 are temporarily turned on in advance when the D/A conversion operation of the converter arrangement of this embodiment is carried out, thereby temporarily connecting the Vout output and the Vstep output to the ground voltage GND.

Figures 7, 8:
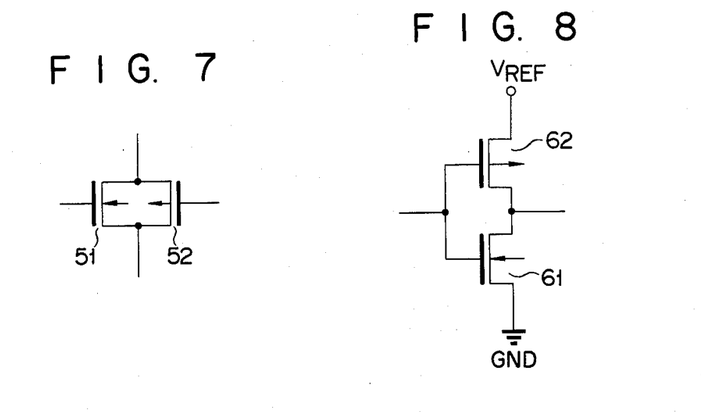
FIGS. 7 and 8 are circuit diagrams which respectively show detailed constructions of two types of switches used in the D/A converter shown in FIG. 6.

FIG. 7 is a circuit diagram showing an example of the detailed construction of each switch $S_0, S_1, \ldots, S_{M-1}$, U1 or U2 incorporated into the D/A converter shown in FIG. 6. As shown in FIG. 7, each switch $S_0, S_1, \ldots, S_{M-1}$, U1 or U2 is constructed such that an N channel enhancement type MOS transistor 51 and a P channel enhancement type MOS transistor 52 are connected in parallel. Complementary signals are inputted to gates of the MOS transistors 51 and 52, thereby making an ON-OFF control of the switch. One of the junctions between the transistors 51 and 52 constitutes one contact of the switch while the other junction constitutes the other contact of the switch. FIG. 8 is a circuit diagram showing an example of the detailed construction of each switch $T_1, \ldots,$ or $T_N$ incorporated into the D/A converter shown in FIG. 6.

As shown in FIG. 8, the switch $T_1, \ldots, T_N$ constitutes a CMOS (Complementary MOS) inverter comprised of an N channel enhancement type MOS transistor 61 and P channel enhancement type MOS transistor 62 connected in series thereto. The respective drains of the MOS transistors 61 and 62 are connected to each other, thereby constituting an inverter output. On the other hand, the respective gates of the transistors 61 and 62 are connected to each other, thereby constituting an inverter input. The upper bits of a digital input data are inputted to the connecting point between the gates of the transistors 61 and 62, which constitutes the inverter input. A connecting point between the drains of the transistors 61 and 62, which constitutes the inverter output, is connected to a corresponding one of the capacitors $C_1, \ldots, C_N$ of the capacitor array.

The operation of the D/A converter shown in FIG. 6 will now be described. As stated before, the switch Sj ($0 \leq j \leq M-1$) is turned on when the output $in_{j+1}$ of the decoder 42 has a logic level of "0". On the other hand, the switch Tj ($1 \leq j \leq N$) selects the reference voltage Vref when the upper bit input $IN_{m-j}$ of a digital input data has a logic level of "1" and selects the ground voltage GND when that bit input has a logic level of "0". That is to say, when the upper bit input $IN_{m-j}$ of the digital input data, with respect to the switch Tj, has a logic level of "1", a corresponding capacitor of the capacitor array $C_1, C_2, \ldots, C_N$ is connected to the reference voltage Vref. When that bit input has a logic level of "0", a corresponding capacitor of the capacitor array $C_1, C_2, \ldots, C_N$ is connected to the ground voltage GND.

In advance of starting the D/A conversion operation, the switches U1 and U2 are turned on. At the same time, each bit input IN1, ..., INn of digital input data is made to have a logic level of "0", whereby each switch T1, ..., $T_N$ selects the ground voltage GND. Thus, the electric charge, accumulated in each of the coupling capacitor C0 and capacitors C1, ..., $C_N$ of the capacitor array, is discharged with the result that the Vout output has a zero potential. Thereafter, the switches U1 and U2 are turned off. In this state, the digital input data to be subjected to D/A conversion are inputted to the converter device, and the D/A conversion operation is carried out. When the D/A conversion operation is started, the following formula (8) is established, with respect to the Vout output, in accordance with a charge maintenance rule.

$$\left( \frac{\sum_{i=1}^{m} 2^{i-1} \cdot INi}{M+1} Vref - Vout \right) C0 + (Vref - Vout) \times \sum_{i=1}^{N} Ci \cdot INm + i = Vout \left( \sum_{i=1}^{N} Ci - \sum_{i=1}^{N} Ci \cdot INm + i \right) \tag{8}$$

Since the bit inputs INi and INm+i have a logic level of "1" or "0", the above formula (8) can be transformed as follows.

$$Vout = \frac{\sum_{i=1}^{N} Ci \cdot INm + i + \sum_{i=1}^{m} 2^{i-1} \cdot C \cdot INi/(M+1)}{\sum_{i=1}^{N} Ci + C} Vref \tag{9}$$

As mentioned above, $$Ci = 2^{i-1} \cdot C1 = 2^{i-1} \cdot C \tag{10}$$

When substituting this relationship into the above formula (9), the following formula (11) is obtained.

$$Vout = \frac{\sum_{i=1}^{N} 2^{i-1} \cdot C \cdot INm + i + \sum_{i=1}^{m} 2^{i-1} \cdot C \cdot INi/(M+1)}{\left( \sum_{i=1}^{N} 2^{i-1} + 1 \right) C} \tag{11}$$

When further substituting $$\sum_{i=1}^{N} 2^{i-1} \cdot 2^N - 1,$$

the following formula (12) is obtained.

$$Vout = \frac{(M+1) \sum_{i=1}^{N} 2^{i-1} \cdot INm + i + \sum_{i=1}^{m} 2^{i-1} \cdot INi}{(M+1)2^N} Vref \tag{12}$$

When further substituting the relationships M+1=m, and N+m=n into the above formula (12), the following formula is obtained.

$$Vout = \frac{\sum_{i=1}^{N} 2^m \cdot 2^{i-1} \cdot INm + i + \sum_{i=1}^{m} 2^{i-1} \cdot INi}{2^m \cdot 2^{n-m}} Vref \tag{13}$$

-continued $$= \frac{\sum_{i=1}^{n} 2^{i-1} \cdot INi}{2^n} Vref$$

Figure 9:
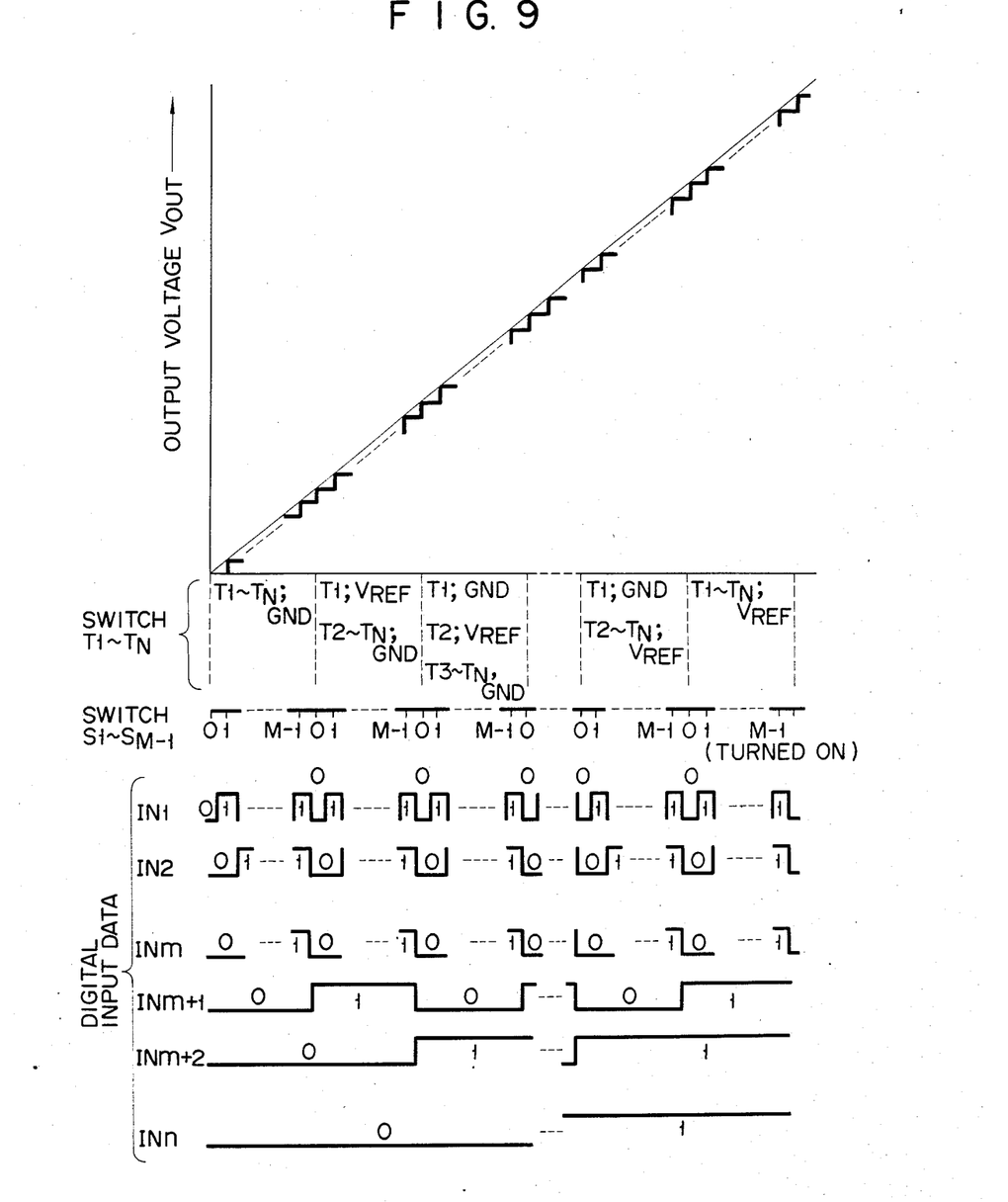
FIG. 9 shows a D/A conversion characteristic of the D/A converter shown in FIG. 6.

If the D/A conversion characteristic expressed by the above formula (13) is graphically shown, it will be exhibited linearly as shown in FIG. 9. What is plotted on the abscissa in regard to the switches T1, ..., $T_N$ indicates to which of the reference voltage Vref and the ground voltage GND each switch T1, ..., or $T_N$ is connected. What is plotted on the abscissa in regard to the switches S1, ..., $S_{M-1}$ indicates the symbol or number of the switch turned on. And what is plotted on the abscissa in regard to the digital input data indicates the logic level "1" or "0" of each input data. As seen from the characteristic curve of FIG. 9, the output voltage Vout indicates a stepwise variation at an equal interval within the output voltage range corresponding to the unit capacitance imparted to the converter circuit when each switch T1, ..., or $T_N$ is turned on, said stepwise variation being allowed to occur each time the switch S0, ..., or $S_{M-1}$ is sequentially turned on.

According to the C-R type D/A converter of this embodiment, where this converter is formed into a MOS LSI (large scale integration) type, the upper bits of digital input data undergo the D/A conversion of the C-array type D/A converter 31 less dependent upon the voltage involved. Accordingly, it is possible to achieve the D/A conversion with higher precision than that attainable where all bits of digital input data are digital-to-analog converted by the R-type D/A converter. Namely, it is possible to make a D/A conversion of around 10 bits. Furthermore, the C-array type D/A converter 31 requires only the capacitors C1, C2, ..., $C_N$ in a number corresponding to the upper bits, i.e., part, of the digital input data. For this reason, even when the respective capacitances of the capacitor array C1, C2, ..., $C_N$ have their values sequentially increased by binary weighting, it is possible to reduce, or set to a reduced value, the capacitance of the capacitor, corresponding to the most significant bit, by setting a reduced value to the unit-capacitance C of the capacitors. This means that it is possible to reduce the area occupied by the capacitors C1, C2, ..., $C_N$ on a semiconductor chip. On the other hand, the segment type D/A converter 32 also has only to make its conversion of part, i.e., the lower bits, of the digital input data, so that it is possible to reduce the number of the resistor elements to a small value. As a result, the area occupied by the resistor elements on a semiconductor chip can be reduced. Accordingly, the C-R type D/A converter of this embodiment can be constructed on a small chip, with the result that the cost involved can be lowered. In addition, only a short period of time is required for the charging and discharging of a signal current at the time of the D/A conversion operation. In addition, a high speed D/A conversion becomes possible.

Figure 10:
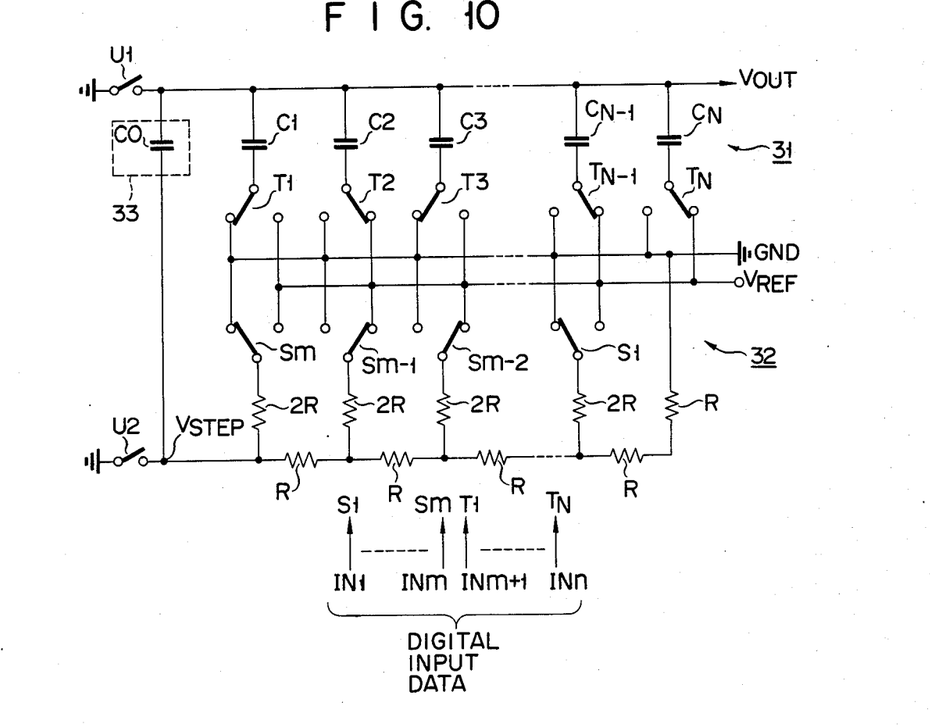
FIG. 10 is a circuit diagram showing the C-R type D/A converter according to another embodiment of the present invention.

FIG. 10 shows the C-R type D/A converter according to another embodiment of the present invention. In the embodiment shown in FIG. 6 while the segment type D/A converter is used as the R type D/A converter, in this second embodiment an R-2R ladder type D/A converter is used. Except for this, the second embodiment is basically the same in construction as the above-mentioned first embodiment and, therefore, the same parts and sections as in the latter embodiment are denoted by like reference numerals and a detailed description thereof is omitted. The R-2R ladder type D/A converter comprises a resistor string comprised of a plurality of resistors R, ..., R connected in series between the ground potential GND and switch U2 and allowed to have substantially the same resistance values, resistors 2R connected at one end to the ends at the switch U2 side of the resistors R of the resistor string (said resistor 2R has a resistance value which is twice as great as the resistance value of the resistor R); and switches S1, ..., Sm−2, Sm−1, Sm connected to the ends at the ground voltage GND side of the resistors 2R and provided from the resistor 2R of the ground voltage side toward the resistor 2R of the switch U2 side corresponding to the resistors 2R. The switch U2 is inserted between the resistor string and the ground voltage GND. The Vstep output is taken out from the resistor-string side of the switch U2. Between the Vstep output and the Vout output, a coupling capacitor C0 is connected and serves as a capacitive coupler 33.

With the above-mentioned construction, the switches S1, ..., Sm are respectively controlled in accordance with the lower bits IN1, ..., INm of digital input data. The switches S1, ..., Sm select the reference voltage Vref when their corresponding bit inputs IN1, ..., INm have a logic level of "1", and select the ground voltage GND when their corresponding bit inputs IN1, ..., INm have a logic level of "0". CMOS inverters such as those shown in FIG. 8 can be used as the switches S1, ..., Sm. The upper bits INm+1, INm+2, ..., INn are inputted to the switches T1, T2, ..., $T_N$, respectively, as in the case of the preceding first embodiment. In this second embodiment as well, similar effects to those obtainable with the first embodiment, shown in FIG. 6, are attained.

As described above, according to the present invention, there is provided a C-R type D/A converter which exhibits a linear D/A conversion characteristic of high precision, which is compact in size, low in manufacturing cost and yet suitable for being made into a MOS LSI construction.

In the above-mentioned embodiments, a linear D/A conversion characteristic has been obtained by a binary weighting in capacitance value of the capacitors C1, C2, ..., $C_N$ of the C-array type D/A converter 31. However, the D/A conversion characteristic curve can be made into a non-linear desired form by suitably changing the weighting rate of one capacitor C1, C2, ..., or $C_N$ relative to another capacitor.

Further, as described above, by setting the capacitance of the capacitive coupler 33 to a unit-capacitance, the amount of variation in each step width of the circuit output voltage Vout is equal within the output voltage variation range corresponding to the unit capacitance of the C-array type D/A converter 31. For example, in FIG. 6, the potential difference between the output voltage Vout, obtained when the switch T1 selects the ground voltage GND and the switch $S_{M-1}$ is turned on, and the output voltage Vout, obtained when the switches S0, S1, ..., $S_{M-1}$ are turned off and the switch T1 selects the reference voltage Vref, is equal to the amount of variation in one step width which occurs within the output voltage variation range corresponding to a one unit-capacitance. Thus, the D/A conversion characteristic curve is interpolated at intervals equal to the one-step variation widths within the output voltage variation range corresponding to the unit-capacitance C of the C-array type D/A converter 31. However, the D/A conversion characteristic curve can be made a non-linear curve by setting the capacitance of the capacitive coupler 33 not to the unit capacitance C but to other desired capacitance values, and thereby making the vertical varition-width corresponding to one step different from that corresponding to an adjacent step.

Briefly, the present invention is not limited to the above-mentioned embodiments, but it should be appreciated that various other modifications may be also contemplated by those skilled in the art without departing from the spirit and scope of the invention.

What is claimed is:

1. A C-R type linear D/A converter for converting a digital word input having a predetermined number of upper and lower bits into an analog value, said converter comprising:

a first portion comprising a C-array type D/A converter for converting said upper bits into an analog value as an output, said first portion comprising a plurality of capacitors having capacitances sequentially weighted in a binary manner, first and second power source voltages, a plurality of first switches corresponding to said capacitors, said first switches responsive to said upper bits of digital input to selectively connect said capacitors to said first power source voltage or said second power source voltage;

a second portion comprising an R-2R type D/A converter for converting said lower bits into an analog value as an output, said second portion comprising a plurality of R-2R type resistors and a plurality of second switches corresponding to said resistors, said second switches and said resistors being connected to said first and second power source voltages, said second switches being controlled by said lower bits of digital input to output a voltage varying in a stepwise manner between said first power source voltage and said second power source voltage; and a capacitive coupler electrically connecting said first and second portions at said output a value corresponding to the sum of the analog values of said first and second portions.

* * * * *